United States Patent
Chu et al.

(10) Patent No.: US 7,790,566 B2
(45) Date of Patent: Sep. 7, 2010

(54) SEMICONDUCTOR SURFACE TREATMENT FOR EPITAXIAL GROWTH

(75) Inventors: Jack Oon Chu, Manhasset, NY (US); Deborah Ann Neumayer, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 12/051,366

(22) Filed: Mar. 19, 2008

(65) Prior Publication Data
US 2009/0239097 A1     Sep. 24, 2009

(51) Int. Cl.
*H01L 21/76* (2006.01)
(52) U.S. Cl. .................... 438/416; 438/46; 438/47; 438/93; 438/94; 438/413; 438/572; 438/590; 438/604; 438/933
(58) Field of Classification Search ............ 438/46, 438/47, 93, 94, 413, 416, 572, 590, 604, 438/933
See application file for complete search history.

(56) References Cited

U.S. PATENT DOCUMENTS

| | | | |
|---|---|---|---|
| 5,120,394 A | * | 6/1992 | Mukai ................... 117/97 |
| 5,130,269 A | * | 7/1992 | Kitahara et al. ........... 117/89 |
| 5,294,565 A | * | 3/1994 | Shiraishi ................ 117/95 |
| 5,300,186 A | * | 4/1994 | Kitahara et al. ........... 117/89 |
| 5,714,006 A | * | 2/1998 | Kizuki et al. ............. 117/89 |
| 6,555,845 B2 | * | 4/2003 | Sunakawa et al. .......... 257/79 |
| 7,259,084 B2 | | 8/2007 | Chang .................. 438/604 |

OTHER PUBLICATIONS

Golfarb et al. in J. Appl. Phys., 93, 3057, (2003).
Rosendo et al., J. Appl. Phys., 89, 3209, (2001).

* cited by examiner

*Primary Examiner*—Andy Huynh
(74) *Attorney, Agent, or Firm*—George Sai-Halasz; Louis J. Percello

(57) ABSTRACT

A method is disclosed for preparing a surface of a Group III-Group V compound semiconductor for epitaxial deposition. The III-V semiconductor surface is treated with boron (B) at a temperature of between about 250° C. and about 350° C. A suitable form for supplying B for the surface treatment is diborane. The B treatment can be followed by epitaxial growth, for instance by a Group IV semiconductor, at temperatures similar to those of the B treatment. The method yields high quality heterojunction, suitable for fabricating a large variety of device structures.

12 Claims, 3 Drawing Sheets

SEMICONDUCTOR SURFACE TREATMENT FOR EPITAXIAL GROWTH

FIELD OF THE INVENTION

The present invention relates to electronic devices and systems. In particular, it relates to methods and structures involving the fabrication of heterojunctions between Group III-Group V compound semiconductors and other crystalline materials with the use of epitaxial deposition.

BACKGROUND OF THE INVENTION

Today's integrated circuits include a vast number of devices. Some advanced devices may benefit in several ways, for instance, by improved performance if they can be fabricated to include more than one type of semiconductor material. The mainstay material of microelectronics is silicon (Si), or more broadly, Si based Group IV semiconductor materials. One such Si based material of importance for microelectronics is the silicon-germanium (SiGe) alloy. For many applications, often involving communication and optical capabilities, Group III-Group V compound semiconductors bring useful properties. Typical representatives of Group III-Group V compound semiconductors, or III-V semiconductors for brevity, are GaAs, GaAlAs, InAs, InP, and many others. Combining Group IV and III-V semiconductors otters many advantages, and has a long history in the art.

The usual, and useful, way of combining Group IV and III-V semiconductors into common structures is by epitaxially depositing one of the materials onto the other. Often one is interested in depositing a Group IV semiconductor epitaxial layer onto the surface of a III-V compound semiconductor. When two different semiconductors, or more generally two different materials, have a common interface it is referred to as a heterojunction.

Ge, Si, SiGe, representative Group IV semiconductors, have been traditionally deposited on GaAs, a representative III-V semiconductor, by molecular beam epitaxy (MBE). The GaAs surface is typically heated to a temperature exceeding 575° C. in an ultra-high vacuum environment of <$10^{-9}$ torr in order to desorb the native gallium arsenide oxide before Ge, Si or SiGe growth can be initiated. However, at high temperatures in vacuum, arsenic desorbs from the GaAs lattice, leaving excess Ga which tends to form droplets, and subsequently, a very rough 3D surface. High overpressures of arsenic containing species have been used to minimize arsenic desorption, but $AsH_3$ is toxic and difficult to handle safely (Golfarb et al. J. APPL. PHYS. 93, 3057, 2003). Similar techniques are employed in magnetron sputtering of Ge/GaAs superlattices by Rosendo et al. J. Appl. Phys. 89, 3209, 2001, where following a wet clean a high vacuum surface oxide degas was necessary prior to Ge growth. However, deposition of Ge on GaAs superlattices at elevated temperatures, such as 580° C., usually resulted in Ge interdiffusion into the GaAs layer. Additionally, significant interdiffusion of Ge and GaAs is observed even at more moderate MBE growth temperatures of 430° C.

The phases of oxides on GaAs may be $AS_2O_3$ and $Ga_2O_3$. The thermodynamics and kinetics indicate that a III-V semiconductor surface, such as a GaAs surface, exposed to air will form a native oxide consisting of gallium oxide and free arsenic.

To counteract the III-V semiconductor surface native oxidation process, several passivants have been proposed through the years. However, none to date has yielded fully satisfactory results.

SUMMARY OF THE INVENTION

Embodiments of the present invention disclose a novel method for epitaxial growth. The method includes providing a surface of a Group III-Group V compound semiconductor and treating this surface with boron (B) at a first temperature of between about 250° C. and about 350° C. The method further involves following the B treatment with an epitaxial growth on the III-V semiconductor surface, at a second temperature, also of between about 250° C. and about 350° C. The method may be carried out by using diborane as a source for B for the surface treatment, and using a Group IV semiconductor for the epitaxial growth.

Embodiments of the present invention further disclose semiconductor devices, which devices include a Group III-Group V compound semiconductor and a Group IV semiconductor. The two semiconductors are having a common interface, as the Group IV semiconductor is an epitaxial layer grown over the Group III-Group V compound semiconductor. This common interface contains boron (B) and oxygen (O).

BRIEF DESCRIPTION OF THE DRAWINGS

These and other features of the present invention will become apparent from the accompanying detailed description and drawings, wherein.

DETAILED

Figure 1:
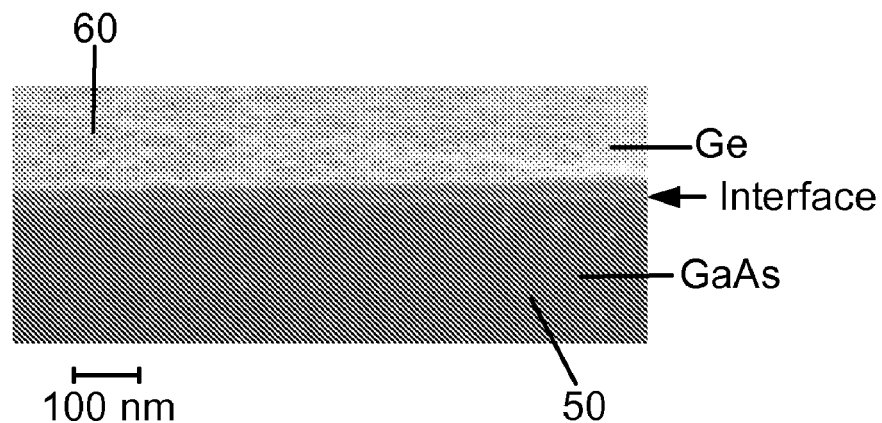
FIG. 1 shows a SEM micrograph of Ge on GaAs, as the Ge was epitaxially grown at 300° C. following a B treatment.

The surfaces of single crystal GaAs, and of some other III-V compound semiconductors, are crystalographically suitable for epitaxial deposition of Group IV semiconductors.

The Group III, IV, and V designation naturally refers to the Periodic table of elements. Representative species of Group III-Group V compound semiconductors (III-V semiconductors for brevity) are, without intent of limitation, GaAs, GaAlAs, InAs, InP, GaN, GaInN, AlGaInN., and others While, representative Group IV semiconductors may be Si, Ge, SiGe, each with possible additions of relatively small amounts of C.

The terms "epitaxial relation", "epitaxially", "epitaxy", "epi", "epitaxial growth" etc. carry their customary usage: meaning that a layer is formed on a crystalline surface, which layer has the same symmetry and crystalline orientation as the crystalline surface itself. Typically, a single crystal lattice structure carries across an interface. Customarily in epitaxy a single crystal, or monocrystalline, material forms a platform onto which another single crystal material with matching crystalline characteristics is deposited by one of several techniques known, in the art. Such techniques include without limitation, for instance, molecular beam epitaxy (MBE), and various types of chemical vapor depositions (CVD).

In embodiments of the present invention the surface of a III-V compound semiconductor is given a boron (B) treatment prior to an epitaxial deposition onto that surface. When two different materials, typically semiconductors, share a common interface, that interface is generally referred to as a heterojunction.

In preparing the surface of a Group III-Group V compound semiconductor for epitaxial deposition the difficulty is in removing the native oxygen (O) from the surface, and furthermore, in not damaging the surface during such a process. The term native refers to the fact that various oxygen compounds readily form on the surface of a Group III-Group V compound semiconductor, not only in atmospheric conditions, but even in supposedly good vacuums, in the range of $10^{-7}$ torr. Even under ultra-high vacuum conditions, below $10^{-9}$ torr, high temperature, typically over about 575° C., is needed to desorb, or passivate, the O on the surface. Passivation means that the oxygen is not necessarily removed from the surface, but by some chemical means it is rendered into a condition that it cannot interfere with the epitaxial process. In a representative embodiment of the invention the III-V compound semiconductor may be GaAs.

Since many high vacuum techniques, such as MBE for instance, are cumbersome and expensive, and in general lower temperature processing is preferable to higher temperature ones. The B treatment of surfaces before epitaxial growth, which does not require high vacuum and leads to excellent epitaxial growth even at low temperatures, has significant advantages.

Boron exhibits strong affinity toward O. If introduced onto a III-V semiconductor surface it may bond to oxygen, and thus passivate it. Such treatment of the III-V semiconductor surface with boron may result in a variety of $BO_x$ compounds on, and near, the surface. Following the B treatment and an epitaxial growth of a Group IV semiconductor, the $BO_x$ compounds may end up at the interface, and possibly intermixing in the neighborhood of the interface, between the Group III-Group V compound semiconductor and the Group IV semiconductor. This neighborhood of the interface where such intermixing may take place is likely to have less than about 2 nm of thickness.

There are well known systems in the electronics arts suitable for epitaxial deposition, and such systems are characterized as being a chemical vapor deposition (CVD) system. In a CVD systems one typically introduces reactants in gaseous form. A boron containing gas suitable for treating the surface of a Group III-Group V compound semiconductor prior to epitaxial growth, was found to be diborane ($B_2H_6$).

Diborane can dissociate exothermically: $B_2H_6 \rightarrow 2BH_3$, with a Keq~$10^{-5}$, and $\Delta H=150$ kj/Mol. And, it can also have a strong exothermal reaction with oxygen $B_2H_6 + 3O_2 \rightarrow B_2O_3 + 3H_2O$, $\Delta H=2050$ kj/Mol.

Representative experiments were carried out in a quartz, horizontal, hot wall, ultra-high-vacuum CVD (UHV-CVD) system. The ultra-high vacuum, typically better than $10^{-8}$ torr, characterization refers to the conditions in the system when there are no reactant gases introduced on purpose. The oxygen concentration in such a system would be in the range below ppb. The pressure during active gas introduction is referred to as the exposure pressure.

Exemplary processing parameters using a UHV-CVD system were as follows. Prior to deposition of germanium (Ge), a GaAs wafer was dipped in dilute, about 10:1, HF for about 60 seconds, blown essentially dry, and then loaded into the CVD reactor in a quartz wafer boat. After loading at a temperature of 300° C., a 1% diborane in He ($B_2H_6$/He) was flowed over the GaAs surface at 90 sccm for one hour, while the GaAs surface was kept at 300° C. The CVD reactor exposure pressure was 100 millitorr during this B treatment of the GaAs surface. After the 60 minutes of $B_2H_6$/He flow, a 10% germane in He ($GeH_4$/He) was flowed into the CVD reactor at 30 sccm. Germane flow is a known procedure for achieving Ge epitaxial growth.

FIG. 1 shows a scanning electron microscope (SEM) micrograph of Ge on GaAs, as the Ge was epitaxially grown at 300° C. following a B treatment. The Ge epitaxial deposition was done for one hour. As the micrograph shows, the Ge layer 60 is of excellent quality, uniform and smooth, over the GaAs substrate 50.

It was observed that when both the B treatment and the epitaxial growth were carried out at about 300° C., the epitaxial layer qualities were close to optimal. In control experiments without the B treatment, epitaxial growth simply did not take place at all at such a low temperature.

A variety of temperatures and exposure pressures for the B treatment and for the epitaxial deposition have been explored. Good results were obtained when a first temperature for the B treatment, which treatment typically was in the form of diborane flow, was between about 250° C. and about 350° C., with the preferred temperature being about 300° C. Similarly, good results were obtained when in the CVD reactor the exposure pressure was between about 10 millitorr and 300 millitorr during the B treatment. The epitaxial growth of the Group IV semiconductor was performed at a second temperature, which, was found to yield good results also between about 250° C. and about 350° C., with a preferred range of between about 280° C. and about 320° C. For depositing essentially pure Ge the preferred second temperature was about 300° C. Interestingly, using temperatures over about 350° C., which in the art would be considered a more favorable temperature for epitaxy, the deposited layer quality was becoming progressively more inferior with increasing temperature.

The smoothness of the epitaxial layers was characterized by the RMS surface roughness as obtained by atomic force microscopy (AFM). For a 340 nm thick Ge layer grown at 300° C., the RMS roughness was approximately 2.4 nm. It was found that this RMS roughness may be further reduced by a higher temperature annealing. However, such annealing was effective if only the surface of the epitaxial layer experienced the higher temperature, and this annealing temperature did not affect the interface region between the III-V semiconductor and the Group IV epi layer. We refer to the annealing with such a temperature profile as near-surface annealing. A near-surface annealing at a temperature between about 500° C. and about 800° C. was found to reduce surface roughness RMS to below about 0.7 nm to 0.9 nm. Such a near-surface annealing may be conveniently accomplished through several laser annealing techniques known in the art.

Equally good results, as with Ge, may be obtained for the epitaxial growth of other Group IV semiconductors under essentially the same conditions, changing only the compound used for the epi layer growth. Thus, using silane $SiH_4$ in alternate embodiments of the invention, good Si epitaxial layers were produced; adding ethylene ($C_2H_4$) and/or methysilane ($CH_3SiH_3$) to the silane in further alternate embodiments of the invention, resulted in good Si:C layers; using silane and germane together in further alternate embodiments of the invention, yielded good SiGe layers of various compositions. In representative embodiments of the invention the epitaxially deposited Group IV semiconductor was selected to be $Si_yGe_{1-y}$, with y being $0 \leq y \leq 1$. The $0 \leq y \leq 1$ range naturally means that essentially pure Si and Ge epitaxial layers are part of representative embodiments of the invention.

Figure 2:
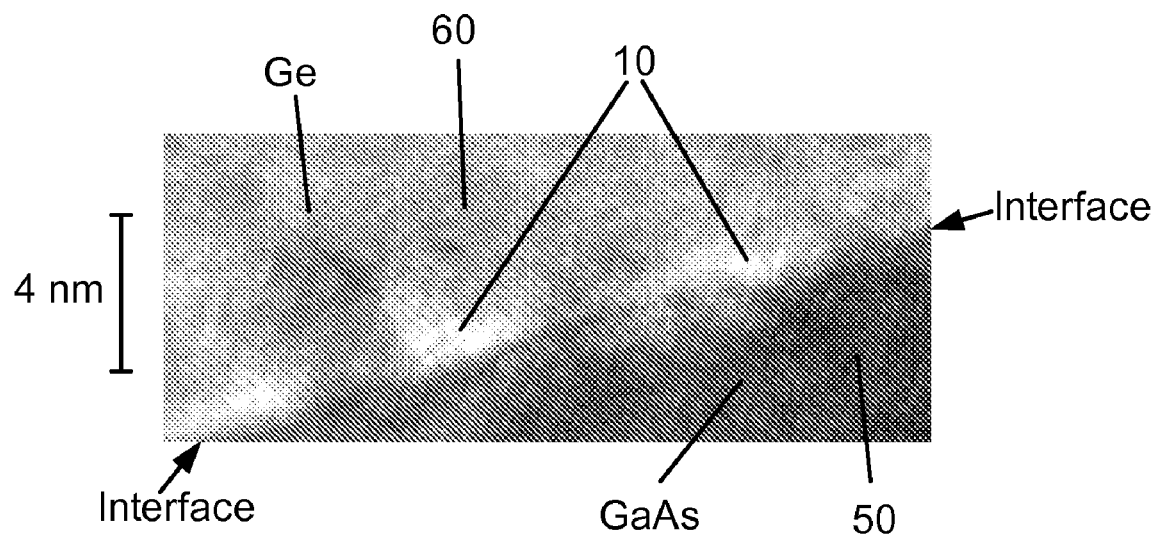
FIG. 2 shows a xTEM micrograph of Ge on GaAs, as the Ge was epitaxially grown at 300° C. following a B treatment.

FIG. 2 shows a xTEM micrograph of Ge on GaAs, as the Ge was epitaxially grown at 300° C. following a B treatment.

At this high magnification the atomic planes of both the single crystal GaAs platform 50 and those of the single crystal Ge epitaxial layer 60 are visible. The interface between the materials is also distinguishable. There are lighter colored spots 10 contained in the neighborhood of the interface. These spots 10 do not show the crystal structure of the semiconductors. The spots 10 may be thicker formations of $BO_x$ compounds which are the result of the B treatment. The B collects, or using an alternate terminology of the arts, "scavenges" the O found on the GaAs surface, and passivates the O to allow excellent epitaxial growth.

Boron treatment of the surface of a Group III-Group V compound semiconductor is not limited to CVD systems, and to $B_2H_6$ gas flow. The B treatment may be equally well implemented in other deposition systems and method, as well. Such systems may include MBE, physical vapor deposition (PVD), various plasma assisted techniques, and others. The applied temperatures and time parameters used in these alternate systems may be similar to those encountered with the CVD system.

The materials that may be epitaxially grown on the III-V compound semiconductor surfaces are not limited to Group IV semiconductors. Treating the III-V compound semiconductor surface with B, as, for example, by using $B_2H_6$, generally improves conditions by passivating the oxygenated surface. Epitaxial growth of other compound semiconductors, or of metals, or of any material that has the crystalline structure suitable for epitaxial growth on III-V compound semiconductor surfaces, can benefit from the disclosed B treatment of the surface.

Having the ability to grew high quality epitaxial Group IV semiconductors on the surface of a Group III-Group V compound semiconductor in such a simple system, like a CVD reactor, and furthermore at a relatively low temperature, opens possibilities for creating novel structures. It also allows for better integration of electronic systems which contain both III-V compound semiconductors and Group IV semiconductor devices. The devices that may be integrated with a Group IV epitaxial layer on a III-V semiconductor may include, without limitation, such structures as transistors, capacitors, diodes, resistors, switches, light emitting diodes, lasers, photodetector, as well as others that may be made possible by the novel technique of B treating the surface of a Group III-Group V compound semiconductor.

Figure 3:
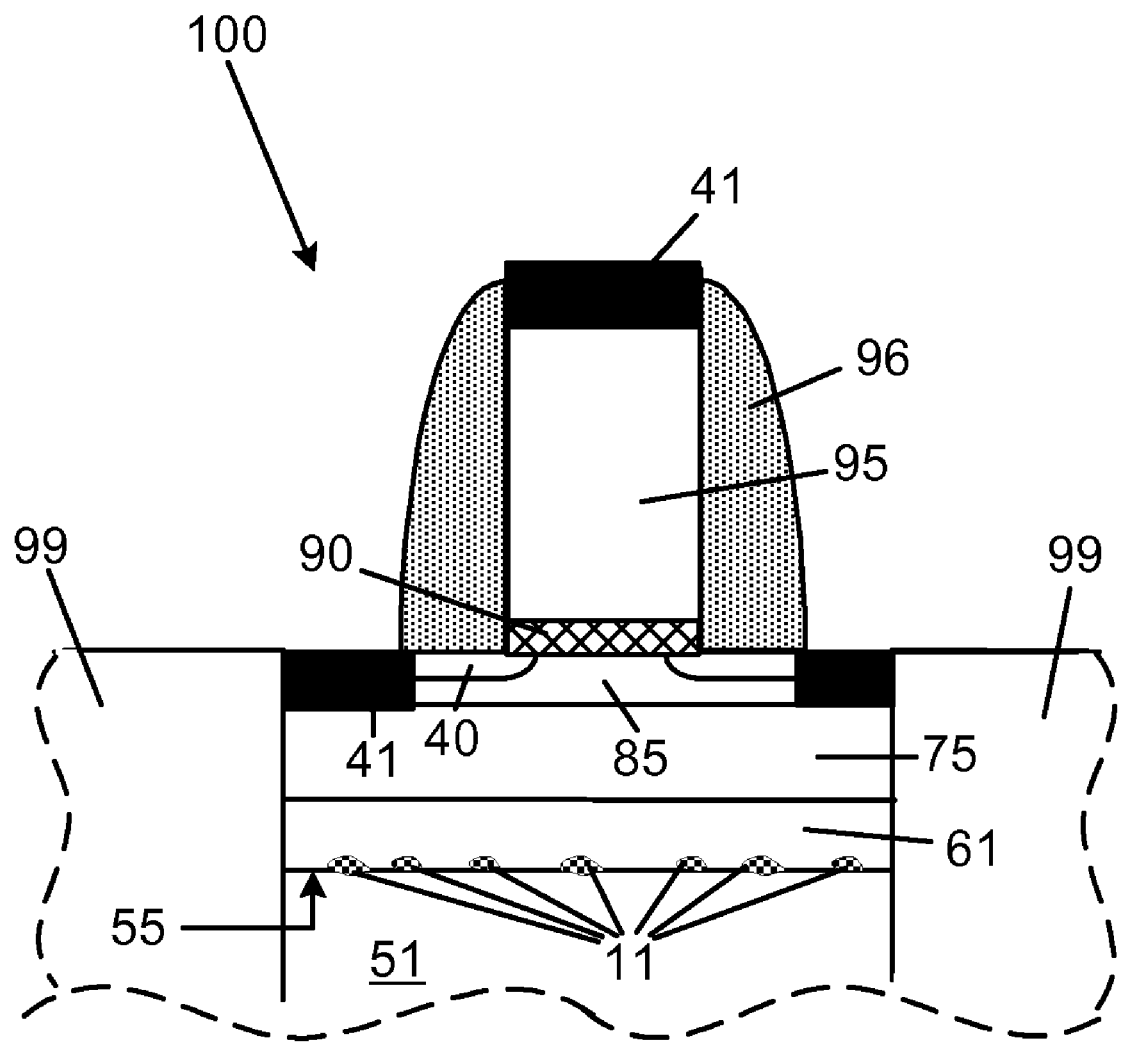
FIG. 3 shows a schematic cross section of a FET device structure according to an embodiment of the present invention.

As an illustration, not as limitation, FIG. 3 shows a schematic cross section of a FET device structure according to an embodiment of the present invention. This FET device 100 belongs to a class in which the device body is strained. The strain is achieved by properly selecting lattice constants of successive epitaxial layers. Such straining, and its advantages are known in the art. In the embodiment shown in FIG. 3 the base surface or the series of epitaxial layers is the surface of a Group III-Group V compound semiconductor.

It is understood that Field Effect Transistor-s (FET) are well known in the electronic arts. Standard component of a FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator. It is also understood that FIG. 3 is only a schematic representation. As known in the art, there may be many more, or less, elements in the device structure presented in the figure, but these would not affect the scope of the embodiments of the present invention.

FIG. 3 shows what typically may be only a small fraction of an electronic chip, for instance a processor, as indicated by the wavy dashed line boundaries. The device may be isolated from other ones by any method known in the art. The figure shows a shallow trench 99 isolation scheme, as this is atypical advanced isolation technique available in the art, A Group III-Group V compound semi conductor platform 51, or substrate, extends to a certain depth, but the platform 51 itself may only be a thin layer. Details of the Group III-Group V compound semiconductor platform are not significant except that it has a surface suitable for hosting the epitaxial layer 61 of a Group IV semiconductor. In FIGS. 1 and 2 the III-V semiconductor was GaAs, and indicated with the number 50, and the epitaxial layer was Ge, indicated as 60. In FIG. 3 these two elements are indicated as 51 and 61, in order to manifest that they are not necessarily GaAs and Ge, although they might be. The Group IV semiconductor epitaxial layer 61 may have a wide range of thicknesses, anywhere between about 1 nm to about 1 μm, typically being between about 10 nm and about 200 nm. Another Group IV epitaxial layer 75, typically SiGe, follows, which may have a composition gradient, and may be relaxed. The device body layer 85, the next epitaxial layer, is strained, and it may be essentially Si. In the depicted embodiment, and if the device body layer is essentially Si, then the device body layer 85 is tensilely strained. Other standard components of the device 100 are the source/drain extensions 40, the silicided source and drain 41, as well as, the silicide 41 on top of the gate stack 95, and the sidewalk 96. As one skilled in the art would know, these elements all have their individual characteristics, but from the point of view of the embodiments of the present invention the individual characteristics of such elements are of no major importance.

The Group III-Group V compound semiconductor platform 51 and the Group IV semiconductor epitaxial layer 61 are having a common interface 55. This common interface 55 in its neighborhood contains B and oxygen O, furthermore it may contain B and oxygen O in the form of $BO_x$ compounds 11. The $BO_x$ compounds 11 are symbolically Indicated on the interface 55. Although, in FIG. 2 the probable $BO_x$ compounds were marked with indicator number 10, in FIG. 3 indicator number 11 is used, again allowing for effects due to possible slight processing variations. The notation of $BO_x$ is itself an indication that there is possible chemical variability involved in this compound. The stoichiometric chemical composition of boron oxide is $B_2O_3$. However, at interfaces, in thin layers, and other non-ideal locations, more complex chemical formations may take place. Hence, the notation of $BO_x$ is used, which allows deviations from the stoichiometric chemical composition of $B_2O_3$.

The amount of $BO_x$ contained in the interface 55 may vary according to how much oxygen was present at the original surface of the Group III-Group V compound semiconductor before the B treatment commenced The interface 55 itself and the interface's immediate neighboring regions in the Group IV semiconductor 61 and in the III-V semiconductor compound platform 55, may contain additional boron not in the form of $BO_x$.

Growing high quality epitaxial Group IV semiconductors, such as pure Ge for instance, on the surface of a Group III-Group V compound semiconductor may also be of use in manufacturing improved photodetectors. The photodetectors typically are in need of thicker epitaxial layers, in which case the epitaxial Group IV semiconductor may reach a thickness of up to several micrometers.

Figure 4:
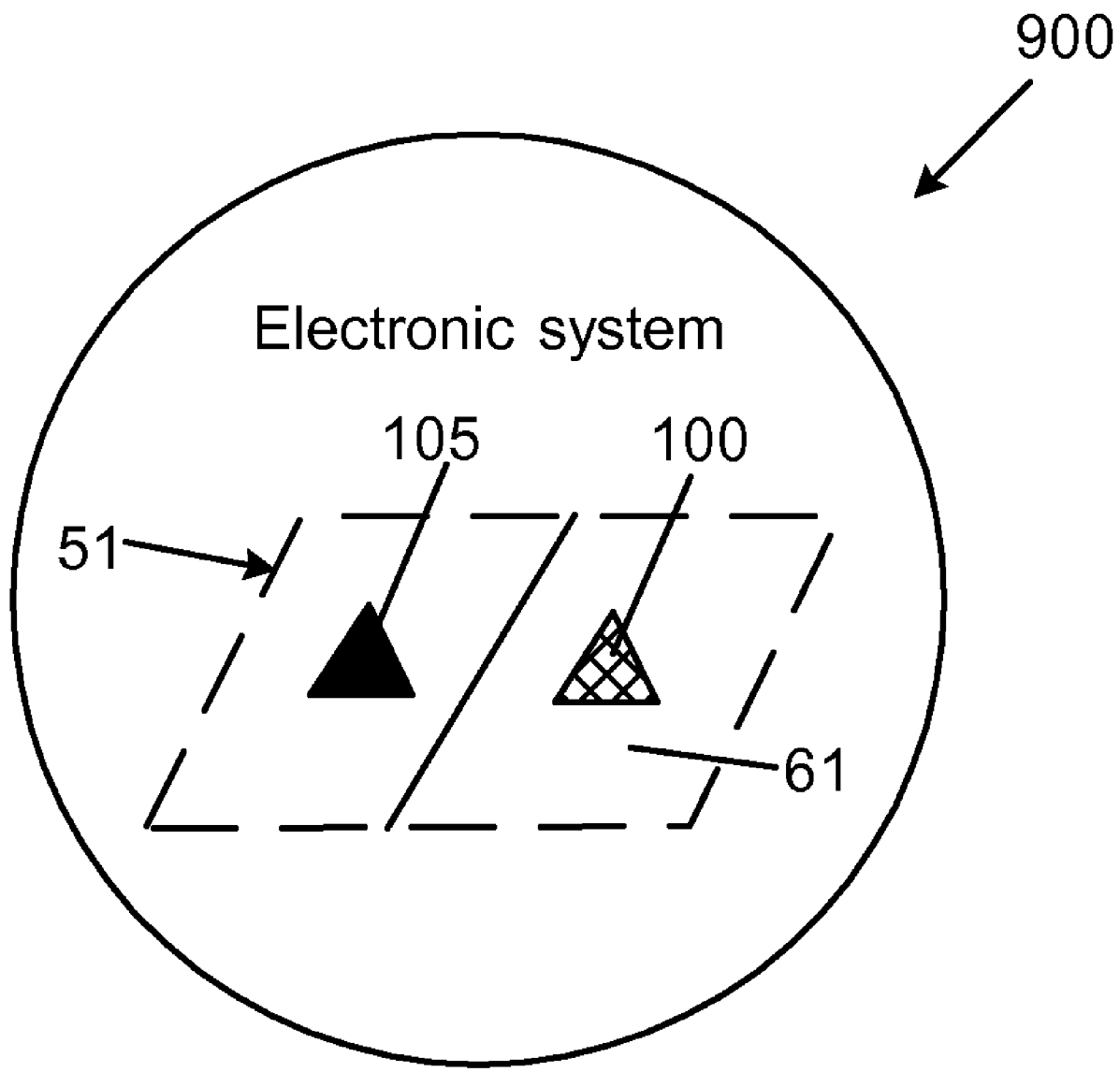
FIG. 4 shows a symbolic view an electronic system having Group III-Group V compound semiconductor devices and Group IV semiconductor devices according to embodiments of the present invention.

FIG. 4 shows a symbolic view an electronic system having Group III-Group V compound semiconductor devices and Group IV semiconductor devices according to an embodiment of the present invention. The electronic system 900 may be any kind, including, but without limitation, digital, or analog, or mixed digital/analog processors, optical capability processors, communications systems, and possible others. The system has a Group III-Group V compound semiconductor platform 51, with a properly oriented surface. The platform 51 has a portion where the platform has an interface with an epitaxial Group IV semiconductor layer 61. This interface comprises boron (B) and oxygen (O), furthermore it may contain B and oxygen O in the form of $BO_x$ compounds. The electronic system 900 has first kind of devices 105, which are characterized as being Group III-Group V compound semiconductor devices, and the electronic system 900 further has second kind of devices 100, characterized as being Group IV semiconductor devices. The first kind of devices 105 are integrated into the platform 51, and the second kind of devices 100 are Integrated into the epitaxial Group IV semiconductor layer 61, The term integrated into conveys the myriad of possibilities in which particular devices fabricated of specific materials may be associated with their host material platforms. For instance, the platforms may be directly forming device bodies, or maybe the platforms serve only as starting point for complicated muitilayered device structures. Embodiments of the present invention have in their scope all such possible variation regarding the association between devices and their host materials.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "top", "side," "on", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A method for epitaxial growth, comprising:
providing a surface of a semiconductor, wherein said semiconductor is selected to be a Group III-Group V compound semiconductor;
treating said surface of said semiconductor with boron (B) at a first temperature of between about 250° C. and about 350° C.; and
performing said epitaxial growth on said surface of said semiconductor at a second temperature of between about 250° C. and about 350° C.

2. The method of claim 1, wherein said epitaxial growth is carried out using a Group IV semiconductor.

3. The method of claim 1, wherein said semiconductor is selected to be GaAs.

4. The method of claim 1, wherein said semiconductor is selected to be GaAlAs.

5. The method of claim 1, wherein said treating of said surface of said semiconductor is carried out using diborane $(B_2H_6)$.

6. The method of claim 5, wherein said method is carried out in a system characterized as being a chemical vapor deposition (CVD) system.

7. The method of claim 6, wherein said diborane is introduced into said CVD system at about 1% concentration in a He carrier gas, flowing at a rate of about 90 sccm, and selecting said first temperature to be about 300° C.

8. The method of claim 7, wherein said treating of said surface of said semiconductor has a time duration of about 60 minutes.

9. The method of claim 8, wherein said method further comprises selecting an exposure pressure in said CVD system to be between about 10 millitorr and about 300 millitorr.

10. The method of claim 2, wherein said Group IV semiconductor is selected to be $Si_yGe_{1-y}$, with y being $0 \leq y \leq 1$, and said second temperature is selected to be between about 280° C. and about 320° C.

11. The method of claim 10, wherein said Group IV semiconductor is selected to be essentially Ge, and said second temperature is selected to be about 300° C.

12. The method of claim 2, wherein said Group IV semiconductor is given a near-surface annealing at a temperature of between about 500° C. and about 800° C.

* * * * *